(12) United States Patent
Hansson

(10) Patent No.: US 7,910,954 B2
(45) Date of Patent: Mar. 22, 2011

(54) IMAGE SENSOR ELEMENT AND IMAGE SENSOR

(75) Inventor: Björn Hansson, Sollentuna (SE)

(73) Assignee: Sony Ericsson Mobile Communications AB, Lund (SE)

( * ) Notice: Subject to any disclaimer, the term of this patent is extended or adjusted under 35 U.S.C. 154(b) by 177 days.

(21) Appl. No.: 12/290,147

(22) Filed: Oct. 28, 2008

(65) Prior Publication Data
US 2010/0102409 A1    Apr. 29, 2010

(51) Int. Cl.
*H01L 51/42* (2006.01)
(52) U.S. Cl. .............. 257/184; 257/461; 257/E31.001; 257/E51.013; 257/E51.017
(58) Field of Classification Search ............ 257/184, 257/461, E51.017
See application file for complete search history.

(56) References Cited

U.S. PATENT DOCUMENTS

| | | | |
|---|---|---|---|
| 4,763,189 A * | 8/1988 | Komatsu et al. | 358/513 |
| 6,271,943 B1 | 8/2001 | Goossen | |
| 2006/0042677 A1 | 3/2006 | Fukunaga et al. | |
| 2006/0043297 A1* | 3/2006 | Ouvrier-Buffet et al. | 250/339.05 |
| 2007/0241260 A1 | 10/2007 | Jaeger et al. | |
| 2008/0128847 A1 | 6/2008 | Woo | |
| 2008/0157254 A1 | 7/2008 | Kang | |

FOREIGN PATENT DOCUMENTS

| | | |
|---|---|---|
| DE | 10 2007 052 168 | 6/2008 |
| EP | 1 667 246 | 6/2006 |
| JP | 2010-153658 | 7/2010 |

OTHER PUBLICATIONS

"Panasonic 3-Layers Image Sensor Patent," <http://egami.blog.so-net.ne.jp/2010-07-19-english>, accessed Aug. 12, 2010.
Chouikha, M. Ben et al., "Colour detection using buried triple pn junction structure implemented in BiCMOS process," Electronics Letters vol. 34, No. 1, pp. 120-122, Jan. 8, 1998.

* cited by examiner

*Primary Examiner* — Zandra Smith
*Assistant Examiner* — Tsz K Chiu
(74) *Attorney, Agent, or Firm* — Peter F. Corless; Steven M. Jensen; Edwards Angell Palmer & Dodge LLP

(57) ABSTRACT

An image sensor element is provided according to an embodiment which comprises image sensor element portions sensitive to at least partially different wavelength ranges.

7 Claims, 2 Drawing Sheets

IMAGE SENSOR ELEMENT AND IMAGE SENSOR

FIELD OF THE INVENTION

This invention relates to image sensor elements and image sensors based on such image sensor elements.

BACKGROUND OF THE INVENTION

Image sensors comprising a plurality of image sensor elements (sometimes also referred to as pixels) are used in many applications, in particular digital cameras like still cameras, video cameras or also cameras integrated in other devices like laptop computers or cellular phones. In such image sensors, image sensor elements are often arranged in the form of an array, wherein the individual image sensor elements for example may be read out columnwise or linewise.

Frequently used image sensors include CCD (charged coupled device) sensors and CMOS (Complementary Metal Oxide Semiconductor) sensors. Sensor elements of these types conventionally are insensitive to the wavelength of the light, i.e. insensitive to the color of the light. To obtain color information for an image, an array of color filters for the primary colors red, blue and green is arranged in a pattern, for example in a so-called Bayer pattern, in front of the sensor elements of the respective image sensor such that each sensor element effectively is sensitive only to one of the primary colors red, green and blue.

Such sensors are conventionally silicon-based sensors. As the fundamental bandgap of silicon is of the order of 1.1 eV corresponding to photon energies in the infrared range, in some applications a filter filtering out infrared light is additionally provided in front of a corresponding image sensor to prevent infrared radiation from modifying an image captured by the image sensor.

SUMMARY OF THE INVENTION

According to an embodiment, an image sensor element, comprising:
a first image sensor element portion sensitive to radiation of a first wavelength range, and
a second image sensor element portion sensitive to radiation of a second wavelength range, said second wavelength range being at least partially different from said first wavelength range, and
a third image sensor element portion sensitive to radiation of a third wavelength range, said third wavelength range being at least partially different from said first wavelength range and at least partially different from said second wavelength range.

The first image sensor element portion may comprise a first active material having a first bandgap, said first bandgap corresponding to an upper boundary of said first wavelength range,
said second image sensor element portion may comprise a second active material having a second bandgap, said second bandgap corresponding to an upper boundary of said second wavelength range and being different from said first bandgap, and
said third image sensor element portion may comprise a third active material having a third bandgap, said third bandgap corresponding to an upper boundary of said third wavelength range and being different from said first bandgap and said second bandgap.

The first active material, the second active material and the third active material may for example be semiconductor materials.

In an embodiment, at least one active material of the group comprising said first active material, said second active material and said third active material comprises semiconductor quantum wells.

Said first wavelength range may consist of wavelengths smaller than 500 nm, said second wavelength range may consist of wavelengths smaller than 570 nm, and said third wavelength range may consist of wavelengths smaller than 650 nm.

In an embodiment, the image sensor element may further comprise a first reflector arranged between said first image sensor element portion and said second image sensor element portion, said first reflector being designed to reflect wavelengths of said first wavelength range, a second reflector arranged between said second image sensor element portion and said third image sensor element portion and being designed to reflect wavelengths of said second wavelength range, and a third reflector arranged adjacent to said third image sensor element portion and being designed to reflect radiation of wavelengths of said third wavelength range.

The first reflector, the second reflector and/or the third reflector may be a distributed Bragg reflector.

According to another embodiment, an image sensor is provided, comprising:
a first image sensor layer sensitive to radiation of a first wavelength range, and
a second image sensor layer sensitive to radiation of a second wavelength range, said second wavelength range being at least partially different from said first wavelength range, and
a third image sensor layer sensitive to radiation of a third wavelength range, said third wavelength range being at least partially different from said first wavelength range and at least partially different from said second wavelength range wherein said image sensor comprises a plurality of image sensor elements.

The image sensor may be based on image sensor elements as described above.

According to a further embodiment, an image sensor is provided, comprising:
a radiation sensitive layer sensitive to radiation of wavelengths below a predetermined wavelength and insensitive to wavelength above said predetermined wavelength,
wherein said wavelength above said predetermined wavelength comprise the infrared spectrum.

Said radiation sensitive layer may comprise a semiconductor material, said semiconductor material having a bandgap corresponding to said predetermined wavelength.

The image sensor may further comprise an ultraviolet filter configured to filter out ultraviolet radiation.

The image sensor, in addition to the radiation sensitive layer, may, but need not comprise at least one further radiation sensitive layer, each of said at least one further radiation sensitive layer being sensitive to radiation of wavelengths below a respective further predetermined wavelength and insensitive to radiation above said respective further predetermined wavelength.

The above features may be combined with each other unless noted to the contrary.

DETAILED DESCRIPTION OF THE INVENTION

Figure 1:
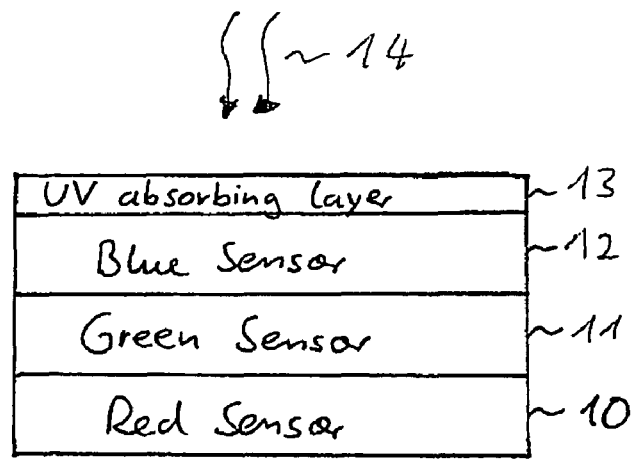
FIG. 1 shows a schematic diagram illustrating a layer structure of an image sensor according to an embodiment of the present invention.

In the following, embodiments of the present invention will be described in detail with reference to the attached drawings. It is to be noted that the embodiments described hereinafter are merely intended to illustrate the present invention and are not to be construed as limiting the scope thereof.

It is to be understood that features of various embodiments described hereinafter may be combined with each other unless specifically noted otherwise.

Furthermore, it is to be understood that describing an embodiment comprising a plurality of elements is not to be construed as indicating that all these elements are necessary for practicing the present invention. Instead, in other embodiments, only some of such elements and/or alternative elements may be present.

It is to be noted that any directional terminology like "top", "bottom", "left" or "right" used in the following detailed description is merely used for easy reference to certain portions of the drawings and is not to be construed as limiting the actual positioning of elements of embodiments in implementations thereof.

In the following, image sensor elements and image sensors comprising such image sensor elements according to embodiments of the present invention will be described.

An image sensor element generally relates to an element which is capable of converting light to an electrically measurable quantity like charge, voltage or current. The embodiments of the present invention described hereinafter in particular relate to semiconductor-based image sensor elements. In such semiconductor-based image sensor elements, like in conventional semiconductor-based image sensor elements, light is detected when the photon energy of the light given by $h\nu$, h being Plank's constant and $\nu$ being the frequency of the light, exceeds the fundamental bandgap of the semiconductor material used as so-called "active material", i.e. as material for detecting light, and the photon is then absorbed creating an electron-hole-pair.

The fundamental bandgap in a semiconductor is generally defined as the energy difference between the point of the valence band with the highest energy and the point of the conduction band with the lowest energy. For example, the bandgap of germanium (Ge) at 300 Kelvin is about 0.66 eV (electron volts), the bandgap of silicon at 300 Kelvin is about 1.12 eV and the bandgap of gallium arsenide (GaAs) at 300 Kelvin is about 1.42 eV. The bandgap somewhat varies depending on temperature and doping of the semiconductor materials.

Generally, for photon energies above the fundamental bandgap, light may be absorbed with a certain probability by the semiconductor by exciting an electron from the valence band to the conduction band thus absorbing the energy, while for photon energies below the fundamental bandgap the semiconductor is essentially transparent. Generally, for so-called direct semiconductors like GaAs, gallium nitride (GaN) or a plurality of other III-V-compounds (compounds of elements from the third and fifth group of the periodic system) the absorption probability is higher than for indirect semiconductors like silicon or germanium.

An image sensor generally comprises a plurality of image sensor elements which may for example be arranged in an array. The number of image sensor elements in the image sensor determines the spatial resolution of the image sensor. For digital cameras, the number of image sensor elements is usually given in megapixels, i.e. millions of picture elements or image sensor elements.

Turning now to FIG. 1, an embodiment of an image sensor according to the present invention is shown. The schematic diagram of FIG. 1 shows four layers of the sensor, a red sensor layer 10, a green sensor layer 11, a blue sensor layer 12 and a UV absorbing layer 13. The image sensor shown in FIG. 1 is designed to detect incident light 14 falling on the image sensor from the side of the UV absorbing layer 13.

The UV absorbing layer 13 is designed to absorb ultraviolet radiation, i.e. radiation above (i.e. with higher energies than) the visible spectrum. Such a UV absorbing layer may for example be a glass layer or a layer made of any other suitable UV absorbing material.

In the embodiment of FIG. 1, the image sensor comprises image sensor elements each having a blue image sensor element portion forming the blue sensor layer, a green sensor element portion forming the green sensor layer and a red sensor element portion forming the red sensor layer.

The blue sensor element portions forming the blue sensor layers are sensitive at least to blue light, for example to light having a wavelength of 500 nm or less, but are essentially transparent to red and green light, for example to light having a wavelength longer than 500 nm.

The green image sensor element portions forming the green sensor layer 11 in the embodiment of FIG. 1 are sensitive at least to green light, for example to light having a wavelength smaller 570 nm, but are essentially transparent to red light, for example light with a wavelength longer than 570 nm.

Finally, the red image sensor element portions forming the red sensor layer are sensitive to red light, for example to light having a wavelength smaller than 650 nm.

With an image sensor as explained with reference to FIG. 1, blue, green and red components of incident light 14 are detected separately in different layers. In particular, in such an image sensor each image sensor element is capable of detecting all three primary components of visible light, i.e. red, green and blue.

It should be noted that in the embodiment of FIG. 1 no infrared filter is necessary since none of the layers 10, 11 and 12 is sensitive to infrared light. However, in other embodiments instead of red sensor layer 10 a layer may be used which is sensitive both to infrared light and red light, for example a silicon-based sensor layer, and an infrared filter may be additionally provided. The infrared filter may be designed as a distributed Bragg reflector (DBR). The structure of such DBRs will be explained further below.

In embodiments of the present invention, the image sensor elements are semiconductor-based image sensor elements. In order to provide the blue image sensor element portion, red image sensor element portion and green image sensor element portion as mentioned above, semiconductor materials having different bandgaps may be used as "active", i.e. light-detecting, materials in corresponding active regions.

This will be further explained with reference to FIG. 2 which shows a schematic bandgap diagram of an image sensor element according to an embodiment of the present invention.

Figure 2:
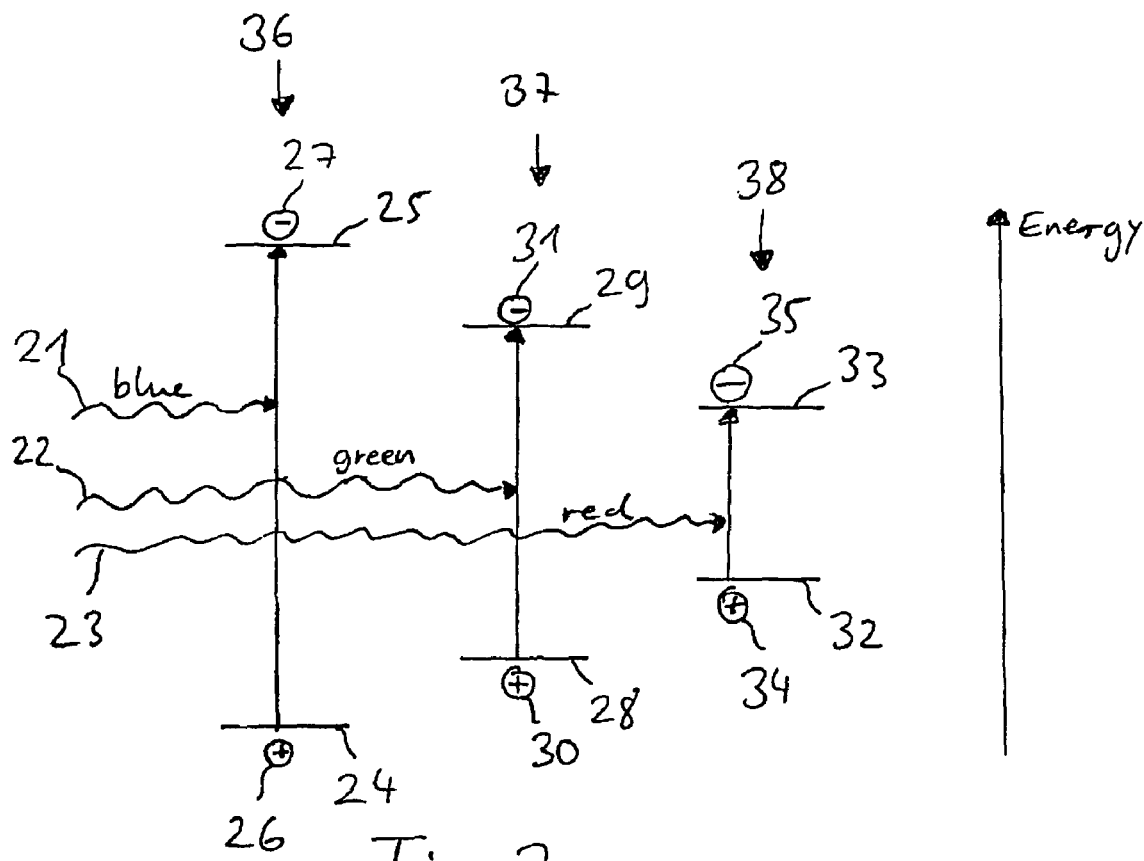
FIG. 2 shows a schematic diagram of an image sensor element according to an embodiment of the present invention.

In the schematic diagram of FIG. 2, light is incident on the image sensor from the left side in FIG. 2. For illustration purposes, a blue light wave 21, which may for example correspond to light having a wavelength of about 450 nm, a green light wave 22 having a wavelength for example of about 550 nm and a red light wave 23 having a wavelength of for example 620 nm are shown.

The image sensor element schematically shown in FIG. 2 comprises a first active region 36 sensitive to blue light, a second active region 37 sensitive to green light and a third active region 38 sensitive to red light. Active region in this respect generally relates to a region where light may be absorbed and converted into some electrical quantity like charge or voltage.

The first active region 36 comprises a first semiconductor material, of which a valence band 24 and a conduction band 25 are shown in a simplified manner. An energy distance between valence band 24 and conduction band 25 corresponding to the fundamental bandgap of the first semiconductor material corresponds to a maximum wavelength to be absorbed and detected by first active region 36. In an embodiment, the fundamental bandgap of the first semiconductor material may correspond to 500 nm, i.e. a bandgap of approximately 2.5 eV (electron volts). Suitable semiconductor materials for the first active region comprise gallium indium phosphate (GaInP)-based materials or gallium indium nitride (GaInN)-based materials.

As schematically shown in FIG. 2, blue light wave 21 is absorbed in first active region 36 by exciting an electron 27 from the valence band 24 to the conduction band 25 leaving a hole 26 in the valence band 24. Such an electron-hole-pair may be detected by any conventional means, for example by integrating active region 36 in a PN diode structure, a CCD structure or a CMOS-like structure.

Second active region 37 comprises a second semiconductor material different from said first semiconductor material, of which a valence band 28 and a conduction band 29 are schematically shown. The fundamental bandgap of the second semi-conductor material is smaller than the fundamental bandgap of the first semiconductor material and is designed such that green light is absorbed, but red light is not absorbed. For example, the fundamental bandgap of the second semiconductor material may correspond to a light wavelength of 570 nm corresponding to 2.18 eV. Suitable materials are for example the compounds mentioned also for the first semiconductor material, but with a higher indium content.

As illustrated schematically in FIG. 2, green light wave 22 is absorbed in the second active region 37 by exciting an electron 31 to the conduction band 29 leaving a hole 30 in valence band 28. These charges, i.e. electron 38 and hole 30, may be detected as already explained for the first active region.

The third active region 38 comprises a third semiconductor material different from the first and second semiconductor materials, of which a valence band 32 and a conduction band 33 are schematically shown. The fundamental bandgap of the third semiconductor material is selected to absorb red light and may for example correspond to a wavelength of 650 nm, i.e. 1.9 eV. Also in this case, for example indium gallium phosphate with correspondingly selected indium and gallium content may be used as semiconductor materials. In another embodiment, for example a gallium aluminum arsenide compound (GaAlAs) may be used.

In the third active region, red light like red light wave 23 is absorbed by exciting an electron like electron 35 from valence band 32 to conduction band 33, leaving a hole 34 in the valence band. The detection of electron 35 and hole 34 may be effected as already explained for the first active region 36.

A plurality of image sensor elements like the one schematically described with reference to FIG. 2 may be used to form an image sensor like the image sensor shown in FIG. 1.

The first, second and third semiconductor materials may be arranged as bulk materials, for example as material layers with a thickness such that no quantum effects occur. In other embodiments, the active regions may comprise multiple quantum well (MQW) structures. An example for such a structure is schematically shown in FIG. 3.

Figures 3, 4, 5:
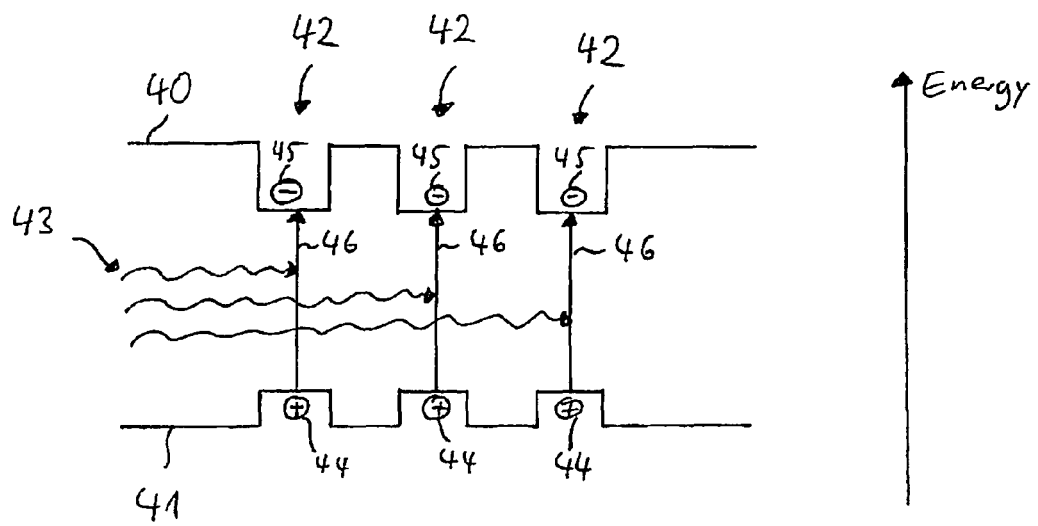
FIG. 3 shows a schematic diagram of a portion of an image sensor element according to an embodiment of the present invention.
FIG. 4 shows a schematic diagram illustrating a layer structure of an image sensor according to another embodiment of the present invention.
FIG. 5 shows a schematic diagram illustrating a layer structure of an image sensor according to yet another embodiment of the present invention.

In FIG. 3 one of the active regions of an image sensor element according to an embodiment is schematically shown. The active region is formed by a semiconductor heterostructure, a valence band 41 and a conduction band 40 of which is schematically shown. In the example of FIG. 3, the active region comprises three quantum wells 42, although any suitable number of quantum wells may be used. Such quantum wells may be formed by inserting thin layers of a first semiconductor material within a second semiconductor material, wherein the first semiconductor material has a smaller bandgap than the second semiconductor material. The bandgap at the quantum wells 42 basically (apart from effects due to quantization) corresponds to the minimum photon energy, i.e. maximum wavelength, of light which may be absorbed and thus detected.

Such quantum wells may have a width in the order of some nanometers, but also may have greater width, for example some 10 nm or even some 100 nm.

Depending on the width of the quantum wells quantized states are formed within the quantum wells which define possible absorption energies between the valence band 41 in the quantum wells and the conduction band 40 in the quantum wells.

Suitable material systems for forming such quantum wells are for example the semiconductor material systems already mentioned with respect to FIG. 2, wherein the ratio of the components is varied to adjust the bandgap.

As schematically shown in FIG. 3, light waves 43 are absorbed in the quantum wells by exciting electrons 45 to the conduction band 40, leaving holes 44 in the valence band.

Without applying an electric field to the semiconductor structure, the thus generated charges (electrons 45 and holes 44) are trapped in the quantum wells. By applying an electric field, they may be read out.

Such quantum well structures may be used in some or all of the active regions of an image sensor element, for example in active regions 36, 37 and/or 38 of the image sensor element of the embodiment of FIG. 2.

It is to be noted that the image sensor element according to embodiments of the present invention may, but need not, comprise components directly connected with each other. For example, in some embodiments the several active regions of an image sensor element may spatially separate and may be connected to be read out jointly with active regions of other image sensor elements, but not be directly connected with each other. For example, in a sensor like the one shown in FIG. 1, the blue sensor element portions of the image sensor elements used may be connected with each other for read out, the green image sensor element portions may be connected with each other for read out and the red image sensor element portions may be connected with each other for read out, but the blue, green, red image sensor element portions of a single image sensor element need not be directly connected with each other.

In the embodiment of FIG. 1, red sensor layer 10, green sensor layer 11 and blue sensor layer 12 are shown without intervening layers. In other embodiments, intervening layers, for example layers for electrical contacting, read out or also reflector layers may be present. An embodiment with reflector layers is shown in FIG. 4.

In the schematic drawing of FIG. 4, a sensor is shown which, similar to the sensor shown in FIG. 1, is designed to receive light from a top side thereof, i.e. from the side of a UV absorbing layer 56 which works similar to UV absorbing layer 13 of the embodiment of FIG. 1. Furthermore, the image sensor of the embodiment of FIG. 4 comprises a red sensor layer 51, a green sensor layer 53 and a blue sensor layer 55 which may be designed as already discussed with respect to red sensor layer 10, green sensor layer 11 and blue sensor layer 12 of the embodiment of FIG. 1, for example by using image sensor elements as discussed with reference to FIGS. 2 and 3.

In addition, between green sensor layer 53 and blue sensor layer 55, a blue reflector layer 54 is arranged, between green sensor layer 53 and red sensor layer 51 a green reflector layer 52 is arranged, and below red sensor layer 51 a red reflector layer 50 is arranged. Blue reflector layer 54 is designed to reflect only blue light but to be transparent to green and red light, green reflector layer 52 is designed to reflect green light but is designed to be transparent to red light, and red reflector layer 50 is designed to reflect red light.

In this way, when light falls on the image sensor of the embodiment of FIG. 4, blue light not absorbed, i.e. detected, by blue sensor layer 55 is reflected by blue reflector layer 54 such that it passes through blue sensor layer 55 again. Therefore, it may be detected in this second passing of blue sensor layer 55. In other words, blue reflector layer 54 basically doubles the effective volume of blue sensor layer 55 since light not detected in the first pass of blue sensor layer 55 may be detected in the second pass after having been reflected.

Likewise, green reflector layer 52 reflects green light not detected by green sensor layer 53 back into green sensor layer 53, and red reflector 50 reflects back light not detected and absorbed by red sensor layer 51 into red sensor layer 51, such increasing the likelihood of detection.

Red reflector layer 50, green reflector layer 52 and blue reflector 54 may be designed as distributed Bragg reflectors (DBRs).

A distributed Bragg reflector is a structure formed from multiple layers of alternating materials with varying refractive index resulting in a periodic variation in the effective refractive index. Each layer boundary in such a structure causes a partial reflection of an optical wave. For waves whose wavelength is close to four times the optical thickness of the layers, many reflections are combined with constructive interference, such that for these wavelengths the structure acts as a high quality optical reflector, while being essentially transparent to other wavelengths. Since semiconductor materials having different bandgap also have different refractive indices, such a distributed Bragg reflector may be implemented as a semiconductor heterostructure somewhat alike to the structure shown in FIG. 3, where the variations of bandgap cause corresponding variations of the refractive index. However, implementations using other materials than semiconductors, for example dielectric materials are also possible in implementations of the present invention.

In the embodiments of FIGS. 1-4, image sensors and image sensor elements comprise three layers or active regions for detecting three different colors, namely blue, green and red corresponding to the components of visible light. In other embodiments, other colors, i.e. other wavelengths of radiation like visible light may be detected, or more than three active regions or layers may be provided to detect more than three different colors. In still other embodiments, less than three active layers in a sensor corresponding to less than three active regions in the individual image sensor elements may be provided. As an example, in FIG. 5 an image sensor is shown with only a single image sensor layer 61. Image sensor layer 61 in the embodiment of FIG. 5 comprises image sensor elements which are sensitive to visible light, but insensitive to infrared light. As an example, in image sensor layer 61 image sensor elements may be used which in an active region comprise a semiconductor material having a bandgap corresponding to about 650 nm or 1.9 eV. In other words, the image sensor layer 61 may basically correspond to the red sensor layers 10, 51 of the embodiments of FIGS. 1 and 4. Since blue and green light is not detected before reaching this layer like in the embodiments of FIGS. 1 and 4, image senor layer 61 detects all the visible light. On the other hand, the energy of infrared light is below the bandgap of such a semiconductor material such that it is not absorbed. For this reason, no infrared filter is necessary in the image sensor of FIG. 5.

Apart from image sensor layers 61, the image sensor of FIG. 5 comprises an UV absorbing layer 62 similar to layer 13 of FIG. 1 and a reflector layer 60 which reflects the visible light back into sensor layer 61. Reflector 60 may be any suitable reflector, for example a distributed Bragg reflector or a combination of distributed Bragg reflectors for different colors. In other embodiments, reflector layer 60 may be omitted.

The present invention is not limited to the embodiments described above, but a plurality of modifications and alterations are possible without departing from the scope of the present invention. For example, other semiconductor materials than the ones mentioned above or non-semiconductor materials having adjustable bandgaps, for example some organic material may be used as active regions in images sensor elements. Therefore, the scope of the present application is intended to be limited only by the appended claims and equivalents thereof.

What is claimed is:

1. An image sensor element, comprising:
    a first image sensor element portion sensitive to radiation of a first wavelength range, wherein the first image sensor element portion comprises a first active material having a first bandgap, said first bandgap corresponding to an upper boundary of said first wavelength range;
    a second image sensor element portion sensitive to radiation of a second wavelength range, said second wavelength range being at least partially different from said first wavelength range, wherein said second image sensor element portion comprises a second active material having a second bandgap, said second bandgap corresponding to an upper boundary of said second wavelength range and being different from said first bandgap; and
    a third image sensor element portion sensitive to radiation of a third wavelength range, said third wavelength range being at least partially different from said first wavelength range and at least partially different from said second wavelength range, wherein said third image sensor element portion comprises a third active material having a third bandgap, said third bandgap corresponding to an upper boundary of said third wavelength range and being different from said first bandgap and said second bandgap, wherein the first active material, the second active material and the third active material are semiconductor materials, and wherein at least one active material of the group comprising said first active material, said second active material and said third active material comprises semiconductor quantum wells.

2. The image sensor element of claim 1, wherein said first wavelength range consists of wavelengths smaller than 500 nm, wherein said second wavelength range consists of wavelengths smaller than 570 nm, and wherein said third wavelength range consists of wavelengths smaller than 650 nm.

3. An image sensor element, comprising:

a first image sensor element portion sensitive to radiation of a first wavelength range;

a second image sensor element portion sensitive to radiation of a second wavelength range, said second wavelength range being at least partially different from said first wavelength range;

a third image sensor element portion sensitive to radiation of a third wavelength range, said third wavelength range being at least partially different from said first wavelength range and at least partially different from said second wavelength range;

a first reflector arranged between said first image sensor element portion and said second image sensor element portion, said first reflector being designed to reflect wavelengths of said first wavelength range;

a second reflector arranged between said second image sensor element portion and said third image sensor element portion and being designed to reflect wavelengths of said second wavelength range; and a third reflector arranged adjacent to said third image sensor element portion and being designed to reflect radiation of wavelengths of said third wavelength range.

4. The image sensor element of claim 3, wherein at least one reflector of the group comprising said first reflector, said second reflector and said third reflector comprises a distributed Bragg reflector.

5. An image sensor, comprising:

a first image sensor layer sensitive to radiation of a first wavelength range, wherein said third image sensor element portion comprises a third active material having a third bandgap, said third bandgap corresponding to an upper boundary of said third wavelength range and being different from said first bandgap and said second bandgap;

a second image sensor layer sensitive to radiation of a second wavelength range, said second wavelength range being at least partially different from said first wavelength range, wherein said second image sensor layer comprises a second semiconductor material having a second bandgap, said second bandgap corresponding to an upper boundary of said second wavelength range and being different from said first bandgap; and a third image sensor layer sensitive to radiation of a third wavelength range, said third wavelength range being at least partially different from said first wavelength range and at least partially different from said second wavelength range wherein said image sensor comprises a plurality of image sensor elements, wherein said third image sensor layer comprises a third semiconductor material having a third bandgap, said third bandgap corresponding to an upper boundary of said third wavelength range and being different from said first bandgap and said second bandgap, wherein at least one active material of the group comprising said first active material, said second active material and said third active material comprises semiconductor quantum wells.

6. An image sensor, comprising:

a first image sensor layer sensitive to radiation of a first wavelength range;

a second image sensor layer sensitive to radiation of a second wavelength range, said second wavelength range being at least partially different from said first wavelength range;

a third image sensor layer sensitive to radiation of a third wavelength range, said third wavelength range being at least partially different from said first wavelength range and at least partially different from said second wavelength range wherein said image sensor comprises a plurality of image sensor elements;

a first reflector arranged between said first image sensor layer and said second image sensor layer, said first reflector being designed to reflect wavelengths of said first wavelength range;

a second reflector arranged between said second image sensor layer and said third image sensor layer and being designed to reflect wavelengths of said second wavelength range; and a third reflector arranged adjacent to said third image sensor layer and being designed to reflect radiation of wavelengths of said third wavelength range.

7. The image sensor of claim 6, wherein at least one reflector of the group comprising said first reflector, said second reflector and said third reflector comprises a distributed Bragg reflector.

* * * * *

UNITED STATES PATENT AND TRADEMARK OFFICE
CERTIFICATE OF CORRECTION

| | | |
|---|---|---|
| PATENT NO. | : 7,910,954 B2 | Page 1 of 1 |
| APPLICATION NO. | : 12/290147 | |
| DATED | : March 22, 2011 | |
| INVENTOR(S) | : Björn Hansson | |

It is certified that error appears in the above-identified patent and that said Letters Patent is hereby corrected as shown below:

In the Claims:

<u>In Claim 5:</u>

At lines 3-8, please replace "wherein said third image sensor element portion comprises a third active material having a third bandgap, said third bandgap corresponding to an upper boundary of said third wavelength range and being different from said first bandgap and said second bandgap" with --wherein the first image sensor layer comprises a first semiconductor material having a first bandgap, said first bandgap corresponding to an upper boundary of said first wavelength range--.

At lines 21-22, please delete "wherein said image sensor comprises a plurality of image sensor elements".

At line 31, after "wells" please add --, wherein said image sensor comprises a plurality of image sensor elements--.

Signed and Sealed this
Thirty-first Day of May, 2011

David J. Kappos
*Director of the United States Patent and Trademark Office*

UNITED STATES PATENT AND TRADEMARK OFFICE
CERTIFICATE OF CORRECTION

Page 1 of 1

PATENT NO. : 7,910,954 B2
APPLICATION NO. : 12/290147
DATED : March 22, 2011
INVENTOR(S) : Björn Hansson It is certified that error appears in the above-identified patent and that said Letters Patent is hereby corrected as shown below:

In the Claims:

Column 9, lines 47-52 (claim 5, lines 3-8) please replace "wherein said third image sensor element portion comprises a third active material having a third bandgap, said third bandgap corresponding to an upper boundary of said third wavelength range and being different from said first bandgap and said second bandgap" with --wherein the first image sensor layer comprises a first semiconductor material having a first bandgap, said first bandgap corresponding to an upper boundary of said first wavelength range--.

Column 10, lines 13-14 (claim 5, lines 21-22) please delete "wherein said image sensor comprises a plurality of image sensor elements".

Column 10, line 23 (claim 5, line 31) after "wells" please add --, wherein said image sensor comprises a plurality of image sensor elements--.

This certificate supersedes the Certificate of Correction issued May 31, 2011.

Signed and Sealed this
Twenty-eighth Day of June, 2011

David J. Kappos
*Director of the United States Patent and Trademark Office*